US012606431B2

(12) United States Patent
　Kobayashi

(10) Patent No.:　US 12,606,431 B2
(45) Date of Patent:　Apr. 21, 2026

(54) MEMS SENSOR PACKAGE AND ITS MANUFACTURING METHOD

(71) Applicant: TDK CORPORATION, Tokyo (JP)

(72) Inventor: Toyotaka Kobayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 321 days.

(21) Appl. No.: 18/142,373

(22) Filed: May 2, 2023

(65) Prior Publication Data

US 2023/0365396 A1　Nov. 16, 2023

(30) Foreign Application Priority Data

May 11, 2022　(JP) ................................. 2022-077860

(51) Int. Cl.
　B81B 3/00　(2006.01)
　B81C 1/00　(2006.01)

(52) U.S. Cl.
　CPC ........ B81B 3/0021 (2013.01); B81C 1/00158 (2013.01); B81B 2201/0257 (2013.01); B81B 2203/0315 (2013.01); B81B 2203/0353 (2013.01); B81B 2207/015 (2013.01); B81C 2201/0154 (2013.01); B81C 2201/0159 (2013.01)

(58) Field of Classification Search
　CPC .......... B81B 7/0061; B81B 2201/0257; B81B 2207/012
　See application file for complete search history.

(56) References Cited

U.S. PATENT DOCUMENTS

| | | | |
|---|---|---|---|
| 8,921,955 B1 * | 12/2014 | Lee ........................ | B81B 7/0061 |
| | | | 257/416 |
| 2010/0303273 A1 | 12/2010 | Sawada | |
| 2012/0237073 A1 * | 9/2012 | Goida ................... | B81B 7/0061 |
| | | | 381/361 |
| 2019/0164807 A1 * | 5/2019 | Wachtler .............. | B81B 7/0048 |

FOREIGN PATENT DOCUMENTS

| | | |
|---|---|---|
| JP | 2008-510427 A | 4/2008 |
| JP | 2010283418 A | 12/2010 |
| JP | P2022-503766 A | 1/2012 |
| JP | 2012090332 A | 5/2012 |
| JP | P2012-182683 A | 9/2012 |

* cited by examiner

*Primary Examiner* — Moazzam Hossain

(74) *Attorney, Agent, or Firm* — YOUNG LAW FIRM, P.C.

(57) ABSTRACT

Disclosed herein is a MEMS sensor package that includes a substrate, an annular-shaped first dry film pattern stuck to one surface of the substrate, and a MEMS sensor chip including a tubular support and a detection part which is supported on the support so as to overlap a cavity of the support. The MEMS sensor chip is fixed to the substrate by sticking an annular mounting surface of the support to the first dry film pattern.

14 Claims, 9 Drawing Sheets

1

MEMS SENSOR PACKAGE AND ITS MANUFACTURING METHOD

BACKGROUND OF THE ART

Field of the Art

The present disclosure relates to a MEMS sensor package and its manufacturing method and, more particularly, to a MEMS sensor package having a structure in which a MEMS sensor chip is mounted on a substrate and its manufacturing method.

Description of Related Art

A MEMS sensor package having a MEMS sensor chip such as a microphone has recently been put to practical use. In a typical MEMS sensor package, a MEMS sensor chip is mounted on a substrate and the MEMS sensor chip and substrate are mutually connected by a bonding wire or the like. In an example described in Japanese Patent No. 4,505, 035, the MEMS sensor chip is fixed onto the substrate by a bonding material. On the other hand, in an example described in JP 2012-090332A, the MEMS sensor chip is fixed onto the substrate by a die-attach material.

However, unlike general IC chips, a MEMS sensor chip such as a microphone has a cavity in a substrate back surface as a mounting surface, causing various problems relating to sticking between the MEMS sensor chip and substrate. For example, with a sticking method achieved by curing a liquid bonding material, it is difficult to adjust the thickness of the bonding material to a designed value, which in some cases may cause inclination of the MEMS sensor chip relative to the substrate. Further, when the amount of the liquid bonding material is excessive, an excess of the liquid bonding material may flow to a bonding pad or a land pattern on the substrate surface or may flow to the inside of a through hole formed in the substrate. Thus, with the sticking method using the liquid bonding material, it is difficult to provide high reliability. On the other hand, with a sticking method using a die-attach film (die-attach material), it is necessary to previously form the die-attach film into an annular shape and to precisely attach the die-attach film, which is difficult to handle, to a target position on the substrate surface, significantly deteriorating working efficiency.

SUMMARY

An object of the present disclosure is therefore to provide a MEMS sensor package and its manufacturing method, capable of achieving excellent work efficiency at manufacturing and providing high reliability.

A MEMS sensor package according to the present disclosure has a substrate, an annular-shaped first dry film pattern stuck to one surface of the substrate, and a MEMS sensor chip including a tubular support and a detection part which is supported on the support so as to overlap a cavity of the support. The MEMS sensor chip is fixed to the substrate by sticking an annular mounting surface of the support to the first dry film pattern.

BRIEF DESCRIPTION OF THE DRAWINGS

The above features and advantages of the present disclosure will be more apparent from the following description of certain preferred embodiments taken in conjunction with the accompanying drawings, in which.

DETAILED DESCRIPTION OF THE EMBODIMENTS

Preferred embodiments of the present disclosure will be explained below in detail with reference to the accompanying drawings.

Figure 1:
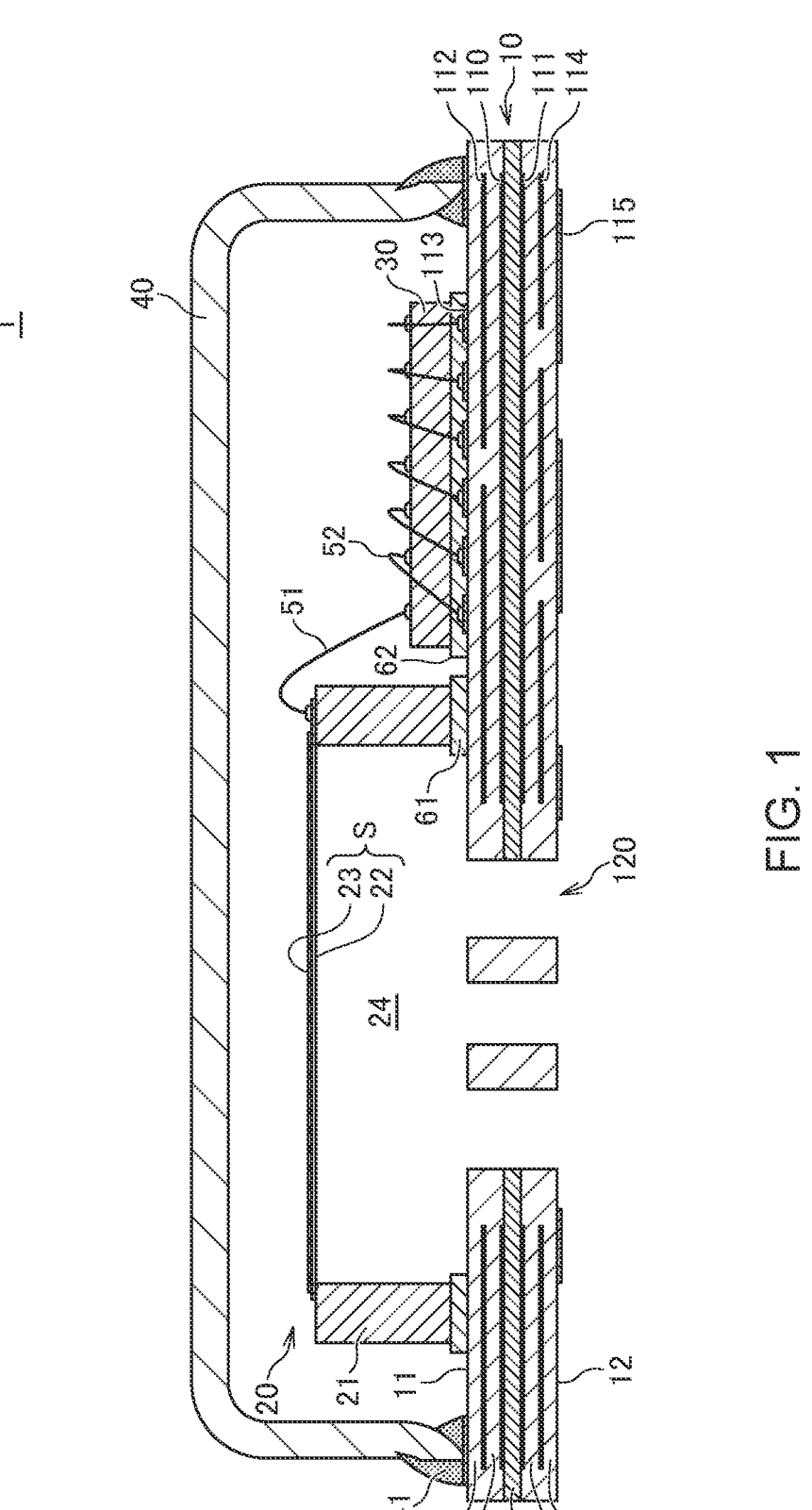
FIG. 1 is a schematic cross-sectional view for explaining the structure of a MEMS sensor package 1 according to an embodiment of the present disclosure.

FIG. 1 is a schematic cross-sectional view for explaining the structure of a MEMS sensor package 1 according to an embodiment of the present disclosure.

As illustrated in FIG. 1, the MEMS sensor package 1 according to the present embodiment includes a substrate 10, a MEMS sensor chip 20 and a controller IC 30 which are mounted on a surface 11 of the substrate 10, and a metal cap 40 covering the MEMS sensor chip 20 and controller IC 30.

The substrate 10 has a multilayer wiring structure including a plurality of insulating layers 101 to 105 and a plurality of conductor layers 110 to 115. The insulating layer 101 is a core layer and is made of a material such as an FR4 board obtained by impregnating a core material with resin. The conductor layers 110 and 111 are formed respectively on the upper and lower surfaces of the insulating layer 101. The conductor layer 110 formed on the upper surface of the insulating layer 101 is covered with the insulating layer 102. The conductor layer 112 is formed on the surface of the insulating layer 102. The conductor layer 112 is covered with the insulating layer 103, and the conductor layer 113 is formed on the surface of the insulating layer 103. The conductor layer 111 formed on the lower surface of the insulating layer 101 is covered with the insulating layer 104. The conductor layer 114 is formed on the surface of the insulating layer 104. The conductor layer 114 is covered with the insulating layer 105, and the conductor layer 115 is formed on the surface of the insulating layer 105. The insulating layers 102 to 105 can be made of a resin material not including a core material and is thus excellent in processability. The surface of the insulating layer 103 positioned in the uppermost layer constitutes the surface 11 of the substrate 10, and the surface of the insulating layer 105 positioned in the lowermost layer constitutes a surface 12 of the substrate 10. The conductor layer 113 formed on the surface 11 of the substrate 10 includes a bonding pad connected to the controller IC 30. The conductor layer 115 formed on the surface 12 of the substrate 10 includes an external surface.

The MEMS sensor chip 20 includes a support 21 made of silicon or the like and a detection part S supported by the support 21. The support 21 has a tubular structure to form a cavity 24, and the detection part S is supported by the support 21 so as to overlap the cavity 24. In the example illustrated in FIG. 1, the detection part S includes a diaphragm 22 and a back plate 23, and the diaphragm 22 is configured to be vibrated by a sound wave. In the present embodiment, the substrate 10 has a through hole 120 therein, and the MEMS sensor chip 20 is mounted on the substrate 10 such that the through hole 120 overlaps the cavity 24. With this configuration, the diaphragm 22 is vibrated by a sound wave transmitted through the through hole 120, and the vibration is converted into an electric signal. That is, in the present embodiment, the MEMS sensor chip 20 constitutes a microphone. However, the MEMS sensor chip 20 is not limited in application to the microphone but may be other types of sensors.

The electric signal generated by the MEMS sensor chip is fed to the controller IC 30 through a bonding wire 51. The controller IC 30 is connected to the bonding pad provided on the surface 11 of the substrate 10. The bonding pad on the surface 11 of the substrate 10 may be directly connected to the MEMS sensor chip 20.

The metal cap 40 is provided on the surface 11 of the substrate 10 so as to cover the MEMS sensor chip 20 and controller IC 30. The metal cap 40 protects the MEMS sensor chip 20 and controller IC 30, functions as an electromagnetic field shield, and acts to enhance acoustic characteristics of the MEMS sensor chip 20. The metal cap 40 is fixed to the substrate 10 using a conductive adhesive 41 such as a solder.

Figure 2:
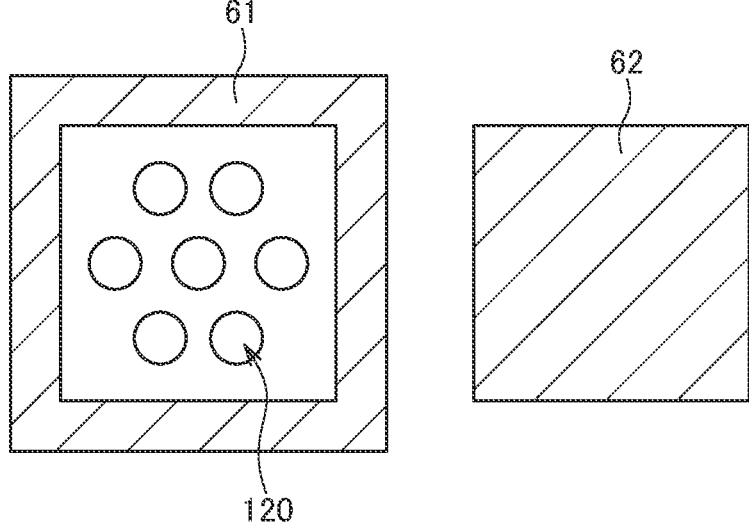
FIG. 2 is a schematic plan view illustrating dry film patterns 61 and 62.

On the other hand, the MEMS sensor chip 20 and controller IC 30 are fixed to the substrate 10 using dry film patterns 61 and 62, respectively. As illustrated in a schematic plan view of FIG. 2, the dry film pattern 61 has an annular structure surrounding the through hole 120 in a plan view. The dry film pattern 61 is stuck at its lower surface to the surface 11 of the substrate 10 and stuck at its upper surface to an annular mounting surface of the support 21 of the MEMS sensor chip 20. The dry film pattern 62 has a rectangular shape in a plan view. The dry film pattern 62 is stuck at its lower surface to the surface 11 of the substrate 10 and stuck at its upper surface to the back surface of the controller IC 30. Both the dry film patterns 61 and 62 are films patterned by exposing and developing a photosensitive dry film resist and act to stick the substrate 10 and MEMS sensor chip 20 together and substrate 10 and controller IC 30 together. Further, the patterns 61 and 62 act to relax a stress caused due to a thermal expansion coefficient difference between the substrate 10 and MEMS sensor chip 20 and between the substrate 10 and controller IC 30.

To sufficiently relax the stress caused due to the thermal expansion coefficient difference, the elastic modulus of each of the dry film patterns 61 and 62 may be 1 MPa or more and 1 GPa or less and preferably 10 MPa or more and 1 GPa or less. When the elastic modulus of each of the dry film patterns 61 and 62 exceeds 1 GPa, the dry film patterns 61 and 62 are deformed insufficiently, resulting in insufficient relaxation of the stress caused due to the thermal expansion coefficient difference. On the other hand, when the elastic modulus of each of the dry film patterns 61 and 62 is less than 10 MPa, the MEMS sensor chip 20 and controller IC 30 may be fixed insufficiently to the substrate 10. To sufficiently relax the stress caused due to the thermal expansion coefficient difference while maintaining high reliability, the elastic modulus of each of the dry film patterns 61 and 62 is more preferably 500 MPa or less.

To relax the stress caused due to the thermal expansion coefficient difference more efficiently, the thickness of each of the dry film patterns 61 and 62 is preferably 20 μm or more and 100 μm or less, and the uniformity of the thickness is ±20% or less. Further, to achieve higher reliability, the dry film patterns 61 and 62 preferably have an adhesive force of 0.5 N or more and 3 N or less in an environment of 20° C. to 80° C.

As described above, in the MEMS sensor package 1 according to the present embodiment, the dry film patterns 61 and 62 are used to fix the MEMS sensor chip 20 and controller IC 30 to the substrate 10, so that it is possible to fix the MEMS sensor chip 20 and controller IC 30 horizontally at a designed height position.

The following describes a manufacturing method for the MEMS sensor package 1 according to the present embodiment.

FIGS. 3 to 9 are process views for explaining the manufacturing method for the MEMS sensor package 1 according to the present embodiment.

Figure 3:
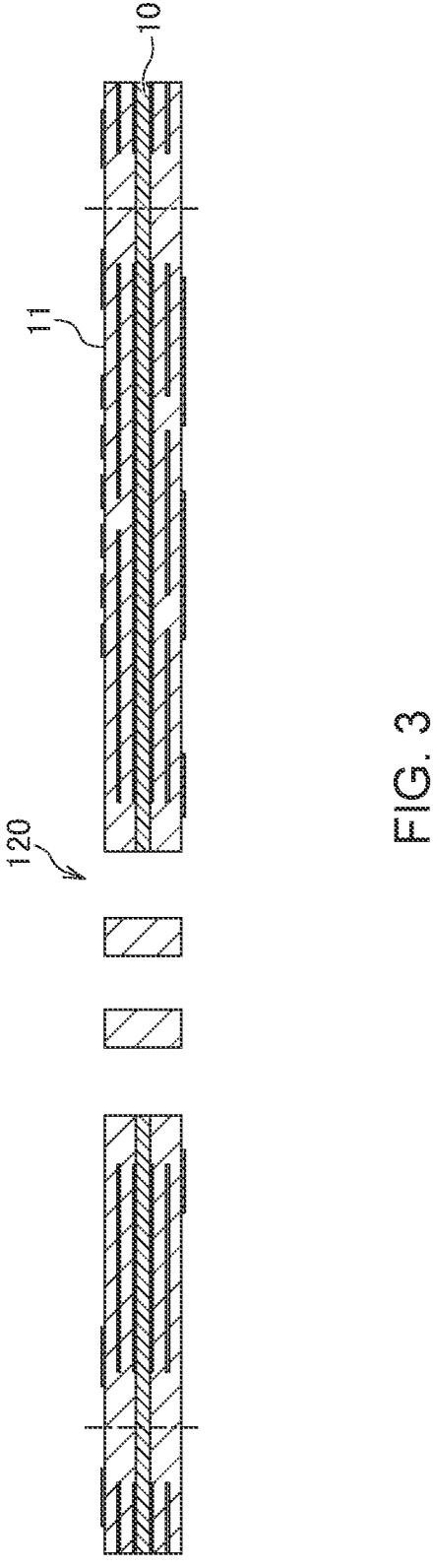
FIGS. 3 to 9 are process views for explaining the manufacturing method for the MEMS sensor package 1.
Figure 4:
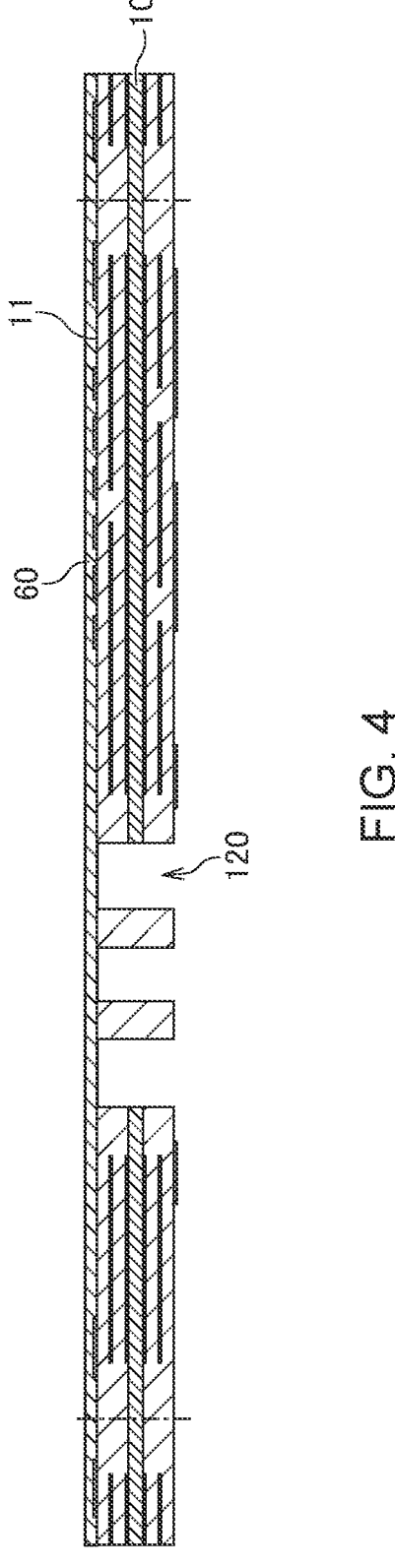
Figure 5:
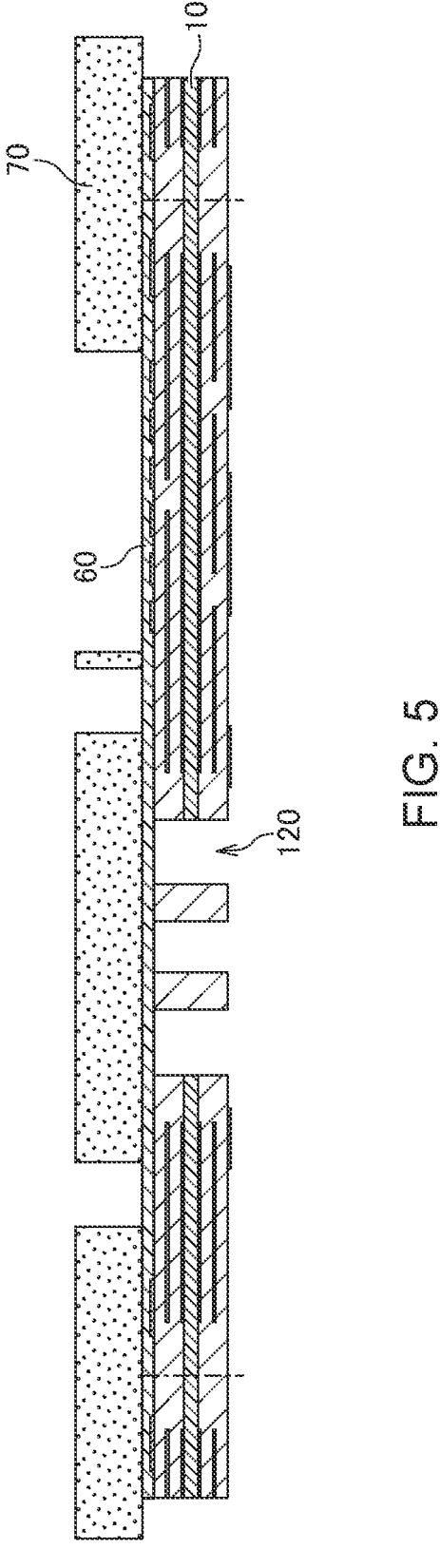
Figure 6:
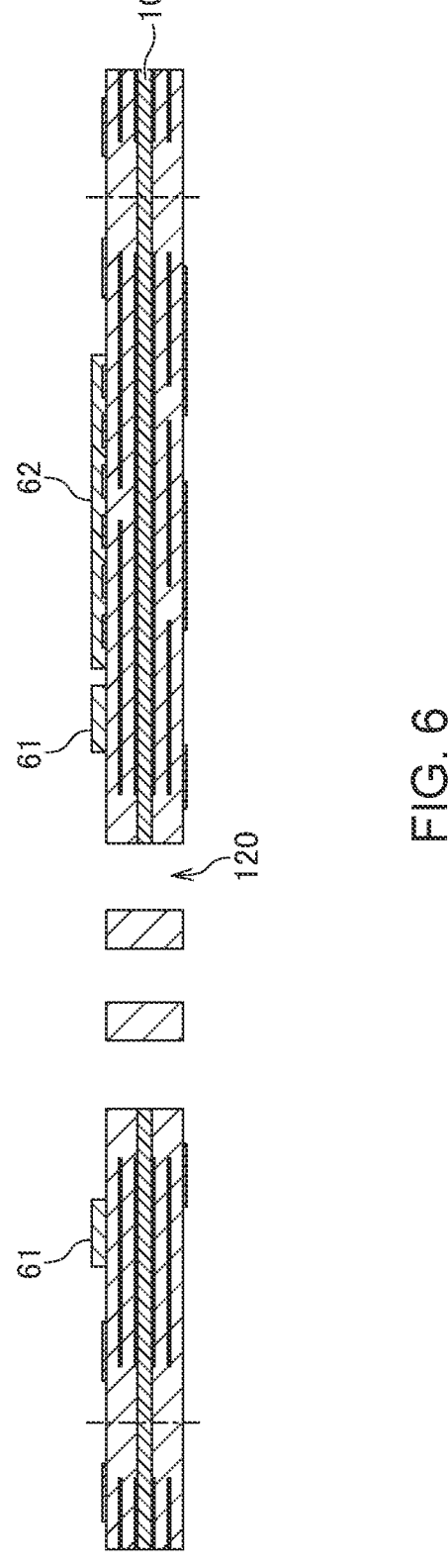

As illustrated in FIG. 3, the substrate 10 having a multilayer wiring structure is prepared, and the through hole 120 is formed therein by drilling or the like. Then, as illustrated in FIG. 4, a photosensitive dry film resist 60 is stuck to the surface 11 of the substrate 10. As the photosensitive dry film resist 60, it is preferable to use a material having an elastic modulus after curing of 10 MPa or more and 1 GPa or less. Then, as illustrated in FIG. 5, exposure is performed through a mask 70, followed by development, whereby the dry film patterns 61 and 62 are formed as illustrated in FIG. 6. At this stage, the dry film patterns 61 and 62 are uncured and thus have high adhesiveness. Further, the dry film patterns 61 and 62 are formed by exposure and development, so that as compared to a method using a die-attach film, the dry film patterns 61 and 62 become highly accurate in position and shape. Furthermore, the dry film patterns 61 and 62 are formed simultaneously, allowing the positional relation therebetween to be made as designed. The number of the dry film patterns is not particularly limited, and three or more dry film patterns may be provided. Even in this case, the number of processes does not increase since the dry film pattern is formed by a photolithography method.

Figure 7:
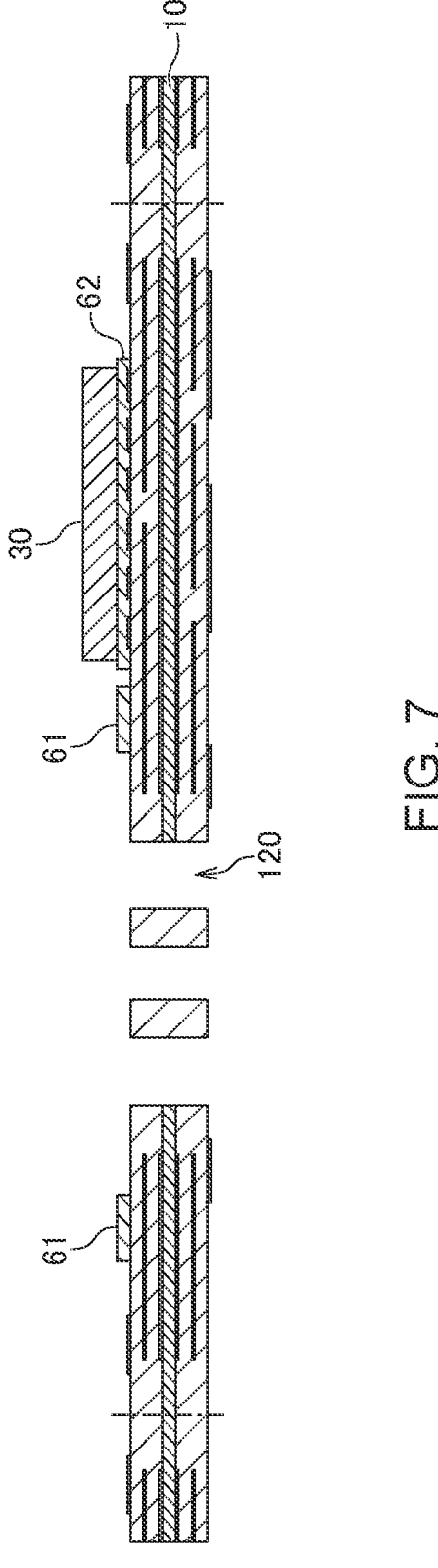
Figure 8:
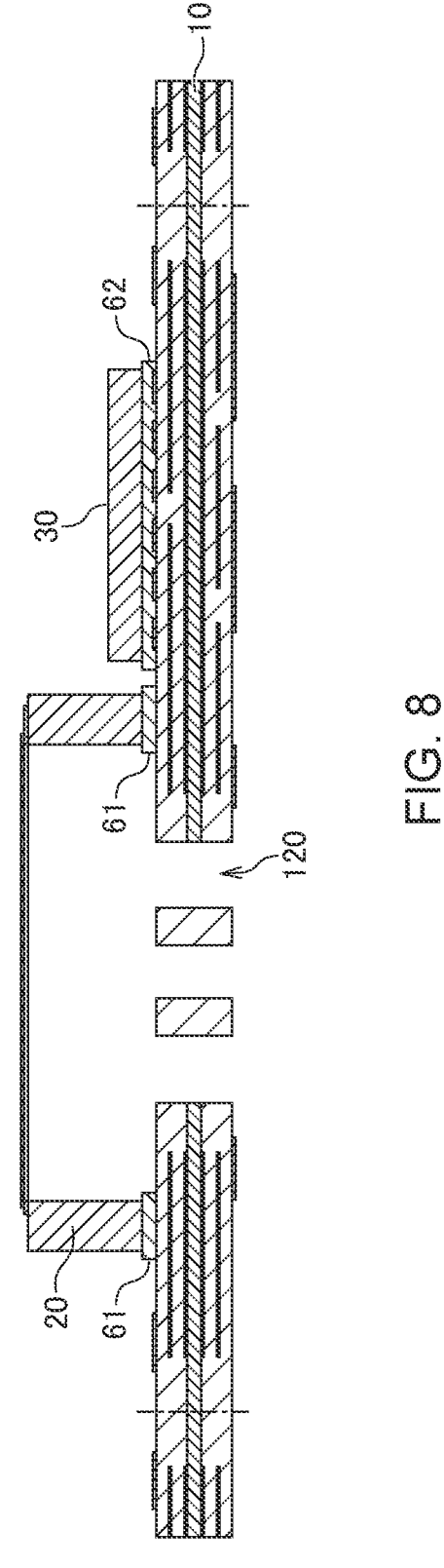

Then, as illustrated in FIG. 7, the controller IC 30 is placed on and stuck to the dry film pattern 62. Subsequently, as illustrated in FIG. 8, the MEMS sensor chip 20 is placed on and stuck to the dry film pattern 61. At this time, the MEMS sensor chip 20 is placed such that the annular mounting surface of the support 21 contacts the annular dry film pattern 61.

Figure 9:
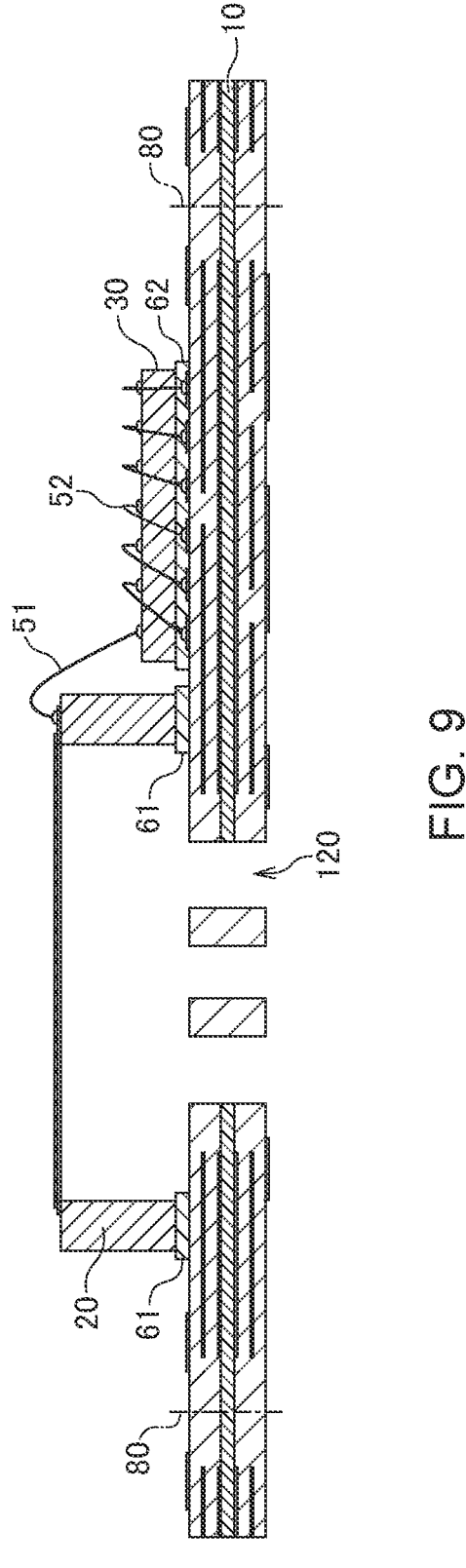

Then, the dry film patterns 61 and 62 are cured by heating, followed by formation of the bonding wires 51 and 52 as illustrated in FIG. 9. After that, when the temperature returns to room temperature, a stress is generated due to a thermal expansion coefficient difference between the substrate 10 and MEMS sensor chip 20 and between the substrate 10 and controller IC 30. In particular, the diaphragm 22 constituting the MEMS sensor chip 20 has a thin thickness and thus may bend when receiving a strong stress. However, in the present embodiment, the elastic modulus of each of the dry film patterns 61 and 62 after curing is lower than general adhesive materials such as epoxy resin (preferably, 10 MPa or more and 1 GPa or less), so that the stress due to the thermal expansion coefficient difference is absorbed by the dry film patterns 61 and 62. This can prevent deformation of the diaphragm 22.

Then, the conductive adhesive 41 such as a solder is used to solder the metal cap 40 to the surface 11 of the substrate 10, followed by singulation of the substrate 10 along a dicing line 80 denoted by the long dashed short dashed line, whereby the MEMS sensor package 1 according to the present embodiment is completed.

As described above, in the present embodiment, the dry film patterns 61 and 62 are formed by exposing and developing the photosensitive dry film resist 60, so that high positional accuracy can be achieved. Further, the annular die-attach material, which is difficult to handle, need not be used, thus allowing achievement of high working efficiency. In addition, since a liquid bonding material is not used, there is no fear that an excess of the liquid bonding material may flow to a bonding pad or a land pattern on the surface 11 of the substrate 10 or may flow to the inside of the through hole 120 formed in the substrate 10. This makes it possible to increase reliability of the MEMS sensor package 1 while achieving high working efficiency.

While the preferred embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A MEMS sensor package according to the present disclosure has a substrate, an annular-shaped first dry film pattern stuck to one surface of the substrate, and a MEMS sensor chip including a tubular support and a detection part which is supported on the support so as to overlap a cavity of the support. The MEMS sensor chip is fixed to the substrate by sticking an annular mounting surface of the support to the first dry film pattern.

According to the present disclosure, the annular dry film pattern is used to stick the MEMS sensor chip to the substrate, so that it is possible to fix the MEMS sensor chip to the substrate without using a liquid bonding material with which it is difficult to achieve high reliability and a die-attach material which is difficult to handle.

In the present disclosure, the substrate may have a through hole therein, and the first dry film pattern may be provided so as to surround the through hole in a plan view. This allows a physical quantity such as sound wave transmitted through the through hole to be detected by the MEMS sensor chip.

In the present disclosure, the elastic modulus of the first dry film pattern may be 1 MPa or more and 1 GPa or less. This can prevent deformation of the detection part due to a thermal expansion coefficient difference between the substrate and MEMS sensor chip.

The MEMS sensor package according to the present disclosure may further have a second dry film pattern stuck to the one surface of the substrate and a controller IC mounted on the one surface of the substrate through the second dry film pattern. This allows the MEMS sensor chip and controller IC to be mounted on the one surface of the substrate.

A MEMS sensor package manufacturing method according to the present disclosure includes a first step of sticking a photosensitive dry film resist on one surface of a substrate, a second step of exposing and developing the photosensitive dry film resist to form an annular-shaped first dry film pattern, a third step of preparing a MEMS sensor chip including a tubular support and a detection part which is supported on the support so as to overlap a cavity of the support and sticking an annular mounting surface of the support to the first dry film pattern, and a fourth step of curing the first dry film pattern.

According to the present disclosure, the photosensitive dry film resist is patterned by a photolithography method, so that it is possible to achieve high working efficiency and to enhance accuracy of the first dry film pattern in terms of position and shape.

In the second step, the second dry film pattern may be formed simultaneously with the first dry film pattern. This allows the second dry film pattern to be formed without increasing the number of working processes. In this case, after the second step and before the fourth step, a step of sticking a controller IC to the second dry film may be performed. This allows the MEMS sensor chip and controller IC to be mounted on the one surface of the substrate.

As described above, according to the present disclosure, there can be provided a MEMS sensor package and its manufacturing method, capable of achieving excellent work efficiency at manufacturing and providing high reliability.

What is claimed is:

1. A MEMS sensor package comprising:
a substrate;
an annular-shaped first dry film pattern stuck to one surface of the substrate; and
a MEMS sensor chip including a support having a tubular shape and a detection part which is supported on the support so as to overlap a cavity of the support,
wherein the MEMS sensor chip is fixed to the substrate by an adhesion of an annular mounting surface of the support to the first dry film pattern.

2. The MEMS sensor package as claimed in claim 1,
wherein the substrate has a through hole therein, and
wherein the first dry film pattern is provided so as to surround the through hole in a plan view.

3. The MEMS sensor package as claimed in claim 1, wherein an elastic modulus of the first dry film pattern is 1 MPa or more and 1 GPa or less.

4. The MEMS sensor package as claimed in claim 1, further comprising:
a second dry film pattern stuck to the one surface of the substrate; and
a controller IC mounted on the one surface of the substrate through the second dry film pattern.

5. The MEMS sensor package as claimed in claim 4, further comprising a bonding wire having a first end connected to the MEMS sensor chip and a second end connected to the controller IC.

6. The MEMS sensor package as claimed in claim 5, wherein the bonding wire is directly connected between the MEMS sensor chip and the controller IC without going through the substrate.

7. The MEMS sensor package as claimed in claim 1, wherein an elastic modulus of the first dry film pattern is 10 MPa or more and 1 GPa or less.

8. The MEMS sensor package as claimed in claim 1,
wherein the substrate includes a plurality of insulating layers and a plurality of conductive layers stacked alternately, and
wherein an uppermost one of the plurality of insulating layers constitutes the one surface of the substrate such that the first dry film pattern is stuck to the uppermost one of the plurality of insulating layers without any of the plurality of conductive layers interposed therebetween.

9. A method for manufacturing a MEMS sensor package, the method comprising:
sticking a photosensitive dry film resist on one surface of a substrate;
exposing and developing the photosensitive dry film resist to form an annular-shaped first dry film pattern;
preparing a MEMS sensor chip including a support having a tubular shape and a detection part which is supported on the support so as to overlap a cavity of the support and sticking an annular mounting surface of the support to the first dry film pattern, and then
curing the first dry film pattern.

10. The method for manufacturing a MEMS sensor package as claimed in claim 9, wherein, in the exposing and developing, the second dry film pattern is formed simultaneously with the first dry film pattern.

11. The method for manufacturing a MEMS sensor package as claimed in claim 10, further comprising sticking a controller IC to the second dry film after the exposing and developing and before the curing.

12. The method for manufacturing a MEMS sensor package as claimed in claim 9, wherein the curing is performed after the sticking.

13. A MEMS sensor package comprising:

a substrate including a plurality of insulating layers and a plurality of conductive layers stacked alternately, the substrate having a through hole;

a dry film pattern stuck to an uppermost one of the plurality of insulating layers such that the dry film pattern surrounds the through hole of the substrate; and a MEMS sensor chip including a support having a tubular shape and a detection part provided on a top surface of the support, wherein the MEMS sensor chip is fixed to the substrate by sticking a bottom surface of the support to the dry film pattern such that a top surface of the dry film pattern is stuck to the bottom surface of the support and a bottom surface of the dry film pattern is stuck to the uppermost one of the plurality of insulating layers.

14. The MEMS sensor package as claimed in claim 13, wherein an elastic modulus of the dry film pattern is 10 MPa or more and 1 GPa or less.

\* \* \* \* \*